(12) United States Patent
Mori

(10) Patent No.: US 8,962,980 B2
(45) Date of Patent: Feb. 24, 2015

(54) DYE-SENSITIZED SOLAR CELL AND METHOD OF MANUFACTURING SAME

(75) Inventor: Hirotaka Mori, Kanagawa (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 846 days.

(21) Appl. No.: 12/458,495

(22) Filed: Jul. 14, 2009

(65) Prior Publication Data

US 2010/0012181 A1     Jan. 21, 2010

(30) Foreign Application Priority Data

Jul. 18, 2008   (JP) .................................. 2008-187466

(51) Int. Cl.
| | | |
|---|---|---|
| *H01G 9/20* | (2006.01) | |
| *H01L 31/0224* | (2006.01) | |
| *H01L 31/0236* | (2006.01) | |
| *H01L 51/44* | (2006.01) | |

(52) U.S. Cl.
CPC ........... *H01G 9/2031* (2013.01); *H01G 9/2068* (2013.01); *H01G 9/2059* (2013.01); *H01L 51/445* (2013.01); *Y02E 10/542* (2013.01)
USPC ................... 136/256; 136/263; 257/E21.158; 438/69

(58) Field of Classification Search
CPC .. H01G 9/2022; H01G 9/2027; H01L 51/442; H01L 51/445
USPC ............. 136/243–265; 438/73; 257/E21.158, 257/E31.124
See application file for complete search history.

(56) References Cited

U.S. PATENT DOCUMENTS

| | | | |
|---|---|---|---|
| 6,444,189 B1* | 9/2002 | Wang et al. .................... | 423/610 |
| 2004/0112421 A1* | 6/2004 | Spivack et al. ................ | 136/256 |
| 2004/0248394 A1* | 12/2004 | Kobayashi et al. ........... | 438/609 |
| 2005/0109391 A1* | 5/2005 | Kobayashi ..................... | 136/263 |
| 2006/0065301 A1* | 3/2006 | Miyoshi ......................... | 136/263 |

FOREIGN PATENT DOCUMENTS

| | | | |
|---|---|---|---|
| JP | 2007012377 A | * | 1/2007 |
| JP | 2007-287593 A | | 11/2007 |

OTHER PUBLICATIONS

JP 2007-012377 English machine translation.*
Shuji Hayase et al., "Proposal for High Efficiency Dye-Sensitized Solar Cell Structure". Technical Digest of the International PVSEC-17, 2007, pp. 81-82.

* cited by examiner

*Primary Examiner* — Jonathan Johnson
*Assistant Examiner* — Andrew Golden
(74) *Attorney, Agent, or Firm* — Rabin & Berdo, P.C.

(57) ABSTRACT

A method of readily forming a dye-sensitized solar cell having a porous layer of increased thickness. The dye-sensitized solar cell includes a translucent substrate, and a plurality of collecting electrode traces formed on the translucent substrate. The solar cell also includes a trench that is trapezoidal in cross-section and is formed on the translucent substrate between the collecting electrode traces. The solar cell also includes a porous layer upon which a sensitizing dye is adsorbed. The porous layer covers the translucent substrate within the trench and the collecting electrode traces.

22 Claims, 4 Drawing Sheets

(P1)

(P2)

(P3)

(P4)

(P5)

DYE-SENSITIZED SOLAR CELL AND METHOD OF MANUFACTURING SAME

BACKGROUND OF THE INVENTION

1. Field of the Invention

The present invention relates to a dye-sensitized solar cell that converts solar energy to electrical energy using a dye, and also relates to a method of manufacturing the same.

2. Description of the Related Art

The amount of solar energy to which the earth is exposed is regarded to be 100,000 times the total amount of energy consumed by its inhabitants.

Solar cells have a 50-year history as devices for converting this resource (sunlight) into electrical energy. The resulting electrical energy is readily used by man.

Renewable energy obtained using solar cells or other means is recognized as an ideal resource because it places virtually no burden on the environment. However, it has not yet become widespread due to the high costs associated with generating electricity thereby.

It is therefore necessary to lower the costs involved in generating electricity in order to invigorate the market, and create an energy-supplying system (society) that is in harmony with nature. To that end, solar cells need to have a higher photoelectric-conversion efficiency, and the associated materials and manufacturing methods need to become less costly.

Dye-sensitized solar cells are viewed as a technology that is capable of resolving these issues.

An exemplary conventional dye-sensitized solar cell includes a glass substrate, and a plurality of strip-shaped collecting electrode traces (wiring) formed on the glass substrate. The conventional dye-sensitized solar cell also includes a porous layer (anode) formed on the glass substrate such that the porous layer directly covers the collecting electrode traces. The porous layer is made from titanium dioxide. A ruthenium metal complex or another sensitizing dye is adsorbed in the porous layer. The conventional dye-sensitized solar cell also includes a metal plate (cathode) having a platinum coating. The metal plate faces the porous layer over an electrolyte solution. The conventional dye-sensitized solar cell also includes a frame for encapsulating the electrolyte solution. The dye-sensitized solar cell is manufactured in the following manner. Firstly, the glass substrate is prepared. A tungsten film is formed on the glass substrate using chemical vapor deposition or another technique. The tungsten film is then photolithographically etched so that the strip-shaped collecting electrode traces are formed. A dispersion containing titanium dioxide microparticles is applied on the glass substrate. The titanium dioxide microparticles measure approximately 20 to 30 nm in diameter. Sintering is performed at about 450° C. for approximately two hours, and the titanium-dioxide porous layer covering the collecting electrode traces is formed. The glass substrate and associated parts are immersed in an alcohol solution containing a ruthenium metal complex, and the ruthenium metal complex is adsorbed onto the surface of the porous layer. The platinum-coated metal plate is joined to the glass substrate with the frame held therebetween. An inner space (or the housing of the solar cell) is defined by the metal plate, glass substrate and frame. An electrolyte solution containing iodine is injected into the resulting space (into the housing of the solar cell) through pinholes provided to the glass substrate.

A thickness T of the collecting electrode traces and a gap A therebetween are made less than a thickness B of the porous layer. A distance C that the farthest excited electron travels to the collecting electrode traces is made approximately equivalent to the diffusion length of the excited electrons. A width W of the collecting electrode traces is reduced in order to increase the opening through which the light enters via the glass substrate on which the collecting electrode traces (which are opaque) are formed. As a result, the photoelectric-conversion efficiency is improved (e.g., see Japanese Patent Application Kokai (Laid-Open) No. 2007-287593, paragraphs 0029 to 0041 and FIG. 1).

Studies into yielding further increases in photoelectric-conversion efficiency have been made over the past several years on dye-sensitized solar cells having a layered-dye structure, wherein sensitizing dyes having different wavelength absorbing regions are provided in two or more layers so as to enlarge the absorbed wavelength region (e.g., see "Proposal for High-Efficiency Dye-sensitized Solar Cell Structure," by Shuji Hayase and three others, Technical Digest of the International PVSEC-17, 2007, pp. 81 to 82).

SUMMARY OF THE INVENTION

As described above, it is essential to increase the photoelectric-conversion efficiency of dye-sensitized solar cells in order to have solar cells come into more widespread use. Inasmuch, it is necessary to increase the amount of sensitizing dye that is adsorbed in the porous layer of the solar cell. However, in order to do so the porous layer must be made thicker, because the amount of sensitizing dye adsorbed per unit volume of the porous layer is fixed.

If Formula 1 shown in FIG. 1 of Japanese Patent Application Kokai No. 2007-287593 is used, the thickness T of the collecting electrode traces formed on the glass substrate can be expressed by:

$$T = B - (C^2 - (A/2)^2)^{0.5}$$

Taking C to be the diffusion length of an excited electron (approximately 10 μm), the thickness T of the collecting electrode traces must be 10 μm or more in order to form a porous layer having a thickness B of 20 μm. Otherwise, it would logically be impossible to capture all of the excited electrons. "A" represents the gap between the collecting electrode traces.

If light permeability (light transmissivity) is considered, the collecting electrode traces are preferably of a smaller width W. After all, it is preferred that the traces are 10 μm or more in height, and the aspect ratio (T/W) becomes extremely high.

One approach for forming collecting electrode traces having such a structure would include the step of forming a tungsten film to a thickness of 10 μm or more, and the step of patterning the film using photolitho-etching. However, it is difficult to accurately form a tungsten film having a thickness of 10 μm or more and to process collecting electrode traces having a high aspect ratio. The actual manufacturing process becomes inordinately complex, and involves a large amount of wasting material.

Such drawbacks are similarly encountered with the dye-sensitized solar cell shown in "Proposal for High Efficiency Dye-sensitized Solar Cell Structure," which has a multilayer structure in which a plurality of sensitizing dyes are layered. In order to improve the photoelectric-conversion efficiency, it becomes necessary to form collecting electrode traces having a high aspect ratio.

It is one object of the present invention to provide a method for readily fabricating a dye-sensitized solar cell having a porous layer of increased thickness.

Another object of the present invention is to provide a dye-sensitized solar cell having a thick(er) porous layer.

According to one aspect of the present invention, there is provided a dye-sensitized solar cell that includes a translucent substrate, and a plurality of collecting electrode traces formed on the translucent substrate. The dye-sensitized solar cell also has a trench that is trapezoidal in cross-section and is formed on the translucent substrate between the collecting electrode traces. The solar cell also has a porous layer upon which at least one kind of sensitizing dye is adsorbed. The porous layer covers the translucent substrate within the trench and the collecting electrode traces.

Because the porous layer fills the trench, the porous layer is substantially thickened as a whole, and the amount of sensitizing dye adsorbed thereon is increased without changing the thickness of the collecting electrode traces and without narrowing the entrance through which light enters via the glass substrate. Thus, it is possible to readily provide a dye-sensitized solar cell having a thicker porous layer and having an improved photoelectric-conversion efficiency.

A depth of the trench may be between 50% and 100% of a diffusion length of an excited electron. A thickness of the porous layer measured from the collecting electrode traces may be equivalent to the diffusion length of the excited electron.

According to another aspect of the present invention, there is provided a method of manufacturing a dye-sensitized solar cell. The method includes providing a translucent substrate, and forming a metal layer on the translucent substrate. The method also includes forming on the metal layer a resist mask that covers a region in which a plurality of collecting electrode traces will be formed. The method also includes etching the metal layer with the resist mask to form the collecting electrode traces on the translucent substrate. The method also includes etching the translucent substrate between the collecting electrode traces with the resist mask to form a trench in a self-aligning manner between the collecting electrode traces. The trench has a trapezoidal cross-sectional shape. The method also includes removing the resist mask and applying a paste containing microparticles of a metallic oxide on the translucent substrate. The method also includes sintering the paste to form a porous layer covering the translucent substrate within the trench and the collecting electrode traces. The method also includes making the porous layer adsorb at least one kind of sensitizing dye therein.

These and other objects, aspects and advantages of the present invention will become apparent to those skilled in the art when the following detailed description is read and understood in conjunction with the appended drawings and claims.

DETAILED DESCRIPTION OF THE INVENTION

An embodiment of a dye-sensitized solar cell according to the present invention and a method for manufacturing the same is described below with reference to the accompanying drawings.

Figure 1:
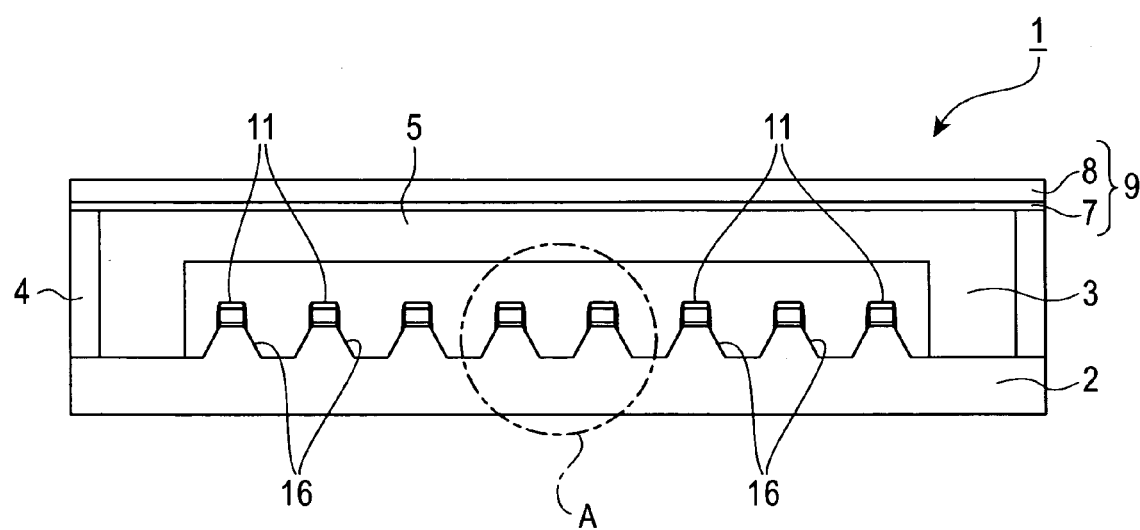
FIG. 1 illustrates a cross-sectional view of a dye-sensitized solar cell according to one embodiment of the present invention.

Referring to FIG. 1, an exemplary dye-sensitized solar cell 1 is described. The dye-sensitized solar cell 1 includes a glass substrate 2, and a porous layer (anode) 3 formed in a center part of an upper surface of the glass substrate 2. The solar cell 1 also includes a counter electrode (cathode) 9 made from an electroconductive metal plate 8. The counter electrode 9 is joined to the glass substrate 2 with a frame 4 held therebetween. The metal plate 8 is coated with a catalyst layer 7. The solar cell 1 also includes an electrolyte solution 5 between the porous layer 3 and the counter electrode 9. The glass substrate 2 is an insulating, translucent substrate. Translucency refers to the property of a material to allow light to pass therethough by virtue of being transparent, semi-transparent, or otherwise not completely opaque). The catalyst layer 7 is made from platinum (Pt) or another catalyst for promoting a reduction reaction with the electrolyte solution 5. The electrolyte solution 5 contains iodine (I) and is sealed within the space defined by the substrate 2, the frame 4, the porous layer 3, and the catalytic layer 7 (or the counter electrode 9).

The porous layer 3 is a semiconductor layer having a nanoporous structure. The porous layer 3 is formed by sintering a paste containing microparticles of titanium oxide ($TiO_2$) or other metallic oxides. For example, Ti-Nanoxide D/SP (Solaronix Inc.) can be used as a titanium oxide paste. A sensitizing dye containing a ruthenium (Ru) metal complex or the like is adsorbed in a surface of the porous structure of the porous layer 3.

Figure 2:
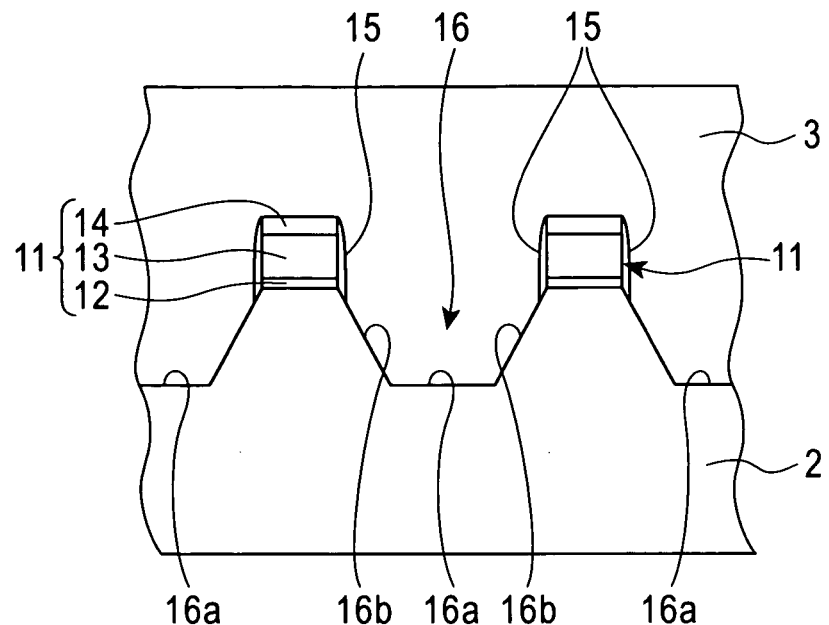
FIG. 2 is an enlarged view of part A of the solar cell shown in FIG. 1.

In FIG. 2, the collecting electrode traces 11 are a plurality of strip-shaped traces extending in a direction vertical to the drawing sheet of FIG. 1. The collecting electrode traces 11 are formed on the upper surface of the glass substrate 2. The collecting electrode traces 11 are formed by layering an adhesive layer 12, a metal layer 13 and a cap layer 14. The adhesive layer 12 is made from titanium nitride (TiN). The metal layer 13 is made from tungsten (W), iridium (Ir), or another electroconductive material. The cap layer 14 is provided for protecting the metal layer 13 against corrosion caused by oxidation and the electrolyte solution 5. The cap layer is made from titanium nitride or a titanium nitride alloy (Ti—Al—N).

Side wall elements 15 formed from the same material as the cap layer 14 are provided on side surfaces of the collecting electrode traces 11. The side wall elements 15 are provided for the same purpose as the cap layer 14.

Figure 3:
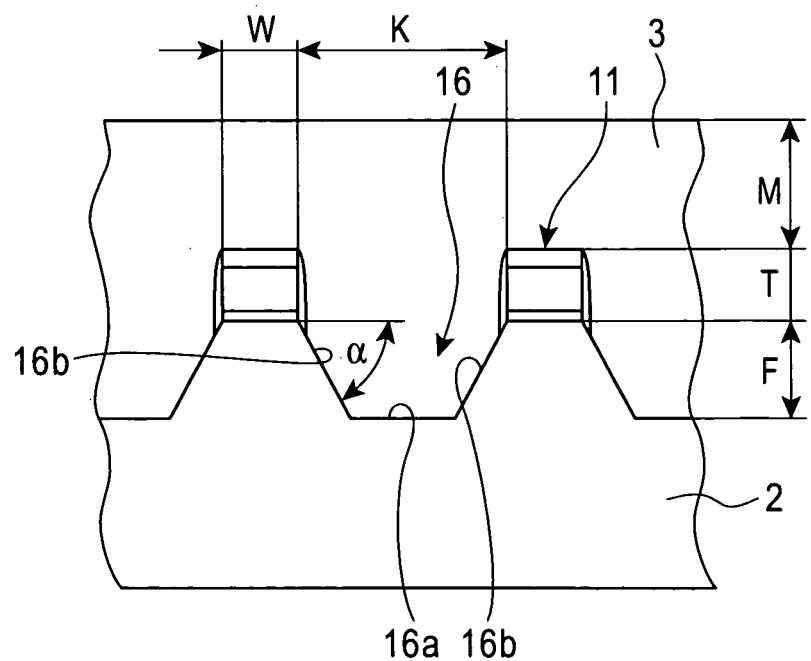
FIG. 3 is an enlarged view showing the shape of a trench formed in the solar cell shown in FIG. 1.

A trench 16 is a groove having a trapezoidal cross-sectional shape. The glass substrate 2 is etched to create the trench 16. The trench 16 is formed between the collecting electrode traces 11. An upper opening of the trench 16 has a width K, which is a gap between the collecting electrode traces 11. It can be said that the width K is the width of the trench 16. The upper opening of the trench 16 has a length which is equivalent to that of the collecting electrode traces 11. The trench 16 has inclined surfaces 16b, which are two inclining edges slanting down toward a bottom 16a of the trench 16. An angle a (alpha) between the inclined edge and the horizontal line (or the upper base of the trapezoid) is about 70° (see FIG. 3).

A groove depth F is decided depending upon the photoelectric-conversion efficiency required for the dye-sensitized solar cell 1. In this embodiment, the depth is between 50% and 100% of a diffusion length of an excited electron (approximately 10 μm).

The gap K between the collecting electrode traces 11 is approximately 150% of the diffusion length of the excited electron. A thickness T and a width W of the collecting electrode trace 11 have normal values (approximately 1% to 15% of the diffusion length of the excited electron). Thus, the aspect ratio T/W between the thickness T and the width W within the above-described range will be approximately 0.5 to 1 depending on the maximum value of the thickness T and the collecting electrode resistance.

The porous layer 3 of the solar cell 1 covers the glass substrate 2 inside the trench 16 and all surfaces of the collecting electrode traces 11 except those in contact with the glass substrate 2. A distance between an upper surface of the collecting electrode traces 11 and an upper surface of the porous layer 3 (i.e., a film thickness M measured from the collecting electrode traces 11) is equivalent to the diffusion length of the excited electron.

In the illustrated embodiment, the term "first structure" of the solar cell 1 refers to the structure shown in FIG. 2, i.e., a structure comprising the glass substrate 2, the collecting electrode traces 11 having the side wall elements 15 formed on the side surfaces thereof, and the porous layer 3 filling in the interior of the trench 16 and covering the collecting electrode traces 11. The term "second structure" of the solar cell 1 refers to the remaining structure, i.e., a structure comprising the counter electrode 9 having the catalyst layer 7, and the frame 4.

Figure 4A:
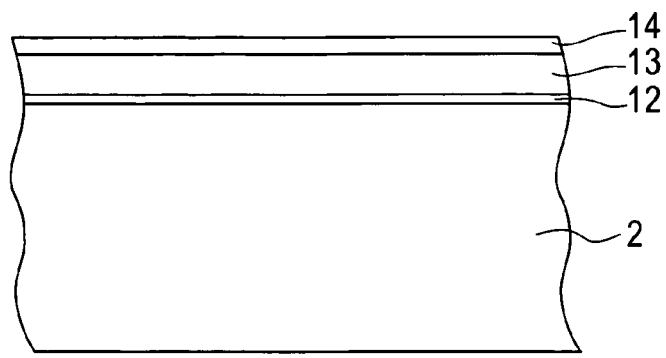
FIG. 4A to 4C and FIG. 5A to 5B depict a series of cross-sectional views illustrating a method for manufacturing the dye-sensitized solar cell of FIG. 1.
Figure 4B:
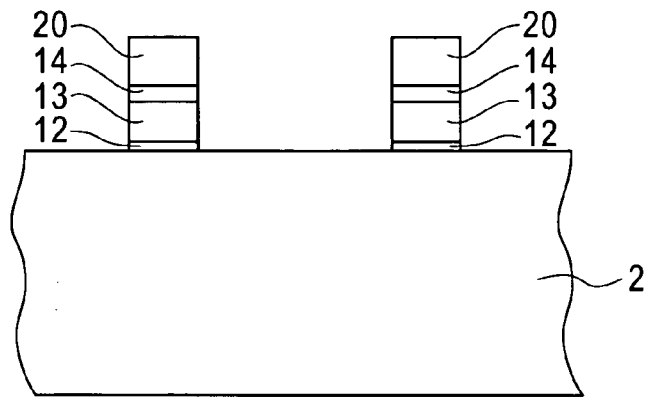
Figure 4C:
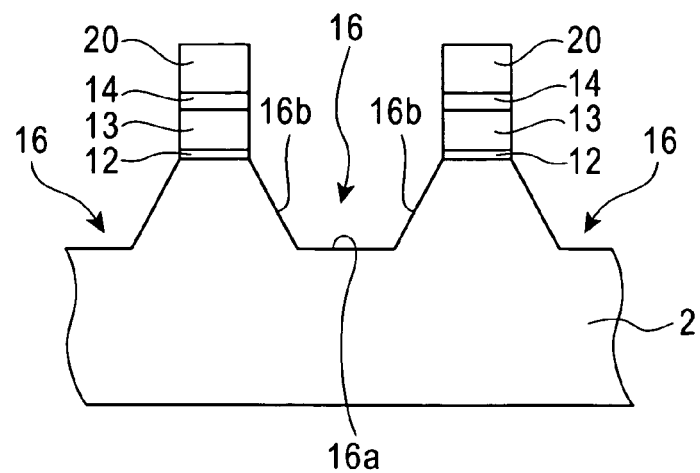
Figure 5A:
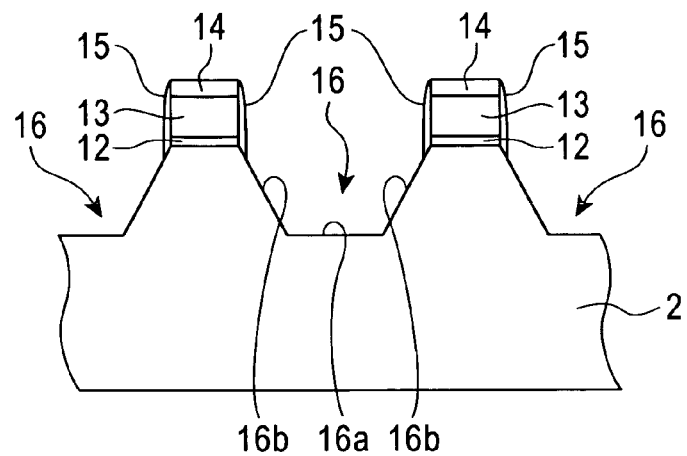
Figure 5B:
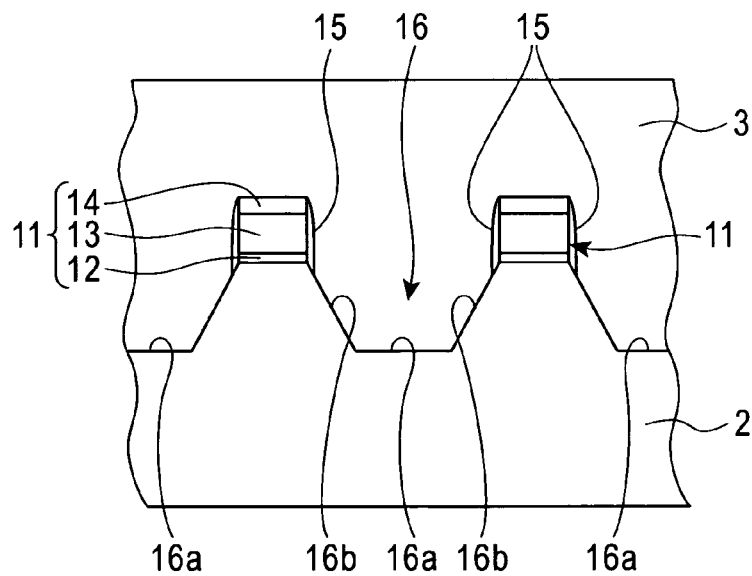

In FIG. 4, a resist mask 20 is a mask member formed by photolithographically exposing and developing a positive or negative resist applied to an upper surface of the glass substrate 2. The resist mask 20 is used as a mask in an etching process and other processes in this embodiment.

In the dye-sensitized solar cell 1 having the above-described configuration, the porous layer 3, which is formed on a center part of the glass substrate 2 and has a sensitizing dye adsorbed thereon, functions as the anode (negative electrode) of the dye-sensitized solar cell 1, and the opposite electrode 9 having the catalyst layer 7 functions as the cathode of the dye-sensitized solar cell 1.

When a connection is established to an external load using an external trace (not shown) such that the external load is connected between the anode and cathode electrodes 3 and 9, and sunlight enters the solar cell 1 through the glass substrate 2, then the sensitizing dye that has been adsorbed onto the surface of the porous structure of the porous layer 3 absorbs light in a particular wavelength range, and releases electrons upon excitation by that light.

When the released excited electrons flow into the collecting electrode traces 11 that are within the range of the electron diffusion length, and flow into the counter electrode 9 after having driven or otherwise affected the external load connected by the external trace, they pass through the iodine in the electrolyte solution 5 before being transferred to the sensitizing dye, which will be positively charged due to the electrons having been released. In this manner, the sensitizing dye returns to its original state.

This type of cycle causes the dye-sensitized solar cell 1 to function as a solar cell that supplies the electric current to the external load.

A method for manufacturing the dye-sensitized solar cell 1 of this embodiment is described below according to the procedure (steps P1 to P5) shown in FIGS. 4A to 4C and FIGS. 5A to 5B.

First, a method for manufacturing the first structure of the solar cell 1 is described.

In the step P1 (FIG. 4A), titanium nitride is deposited on the upper surface of the glass substrate 2 by sputtering or chemical vapor deposition (CVD) such that an adhesive layer 12 is formed to a thickness of approximately 10 to 100 nm. An electroconductive material is deposited on the adhesive layer 12 by sputtering or CVD such that a metal layer 13 is formed to a thickness of approximately 50 to 1000 nm. Titanium nitride or the like is deposited on the metal layer 13 by sputtering or CVD such that a cap layer 14 is formed to a thickness of 10 to 300 nm.

In the step P2 (FIG. 4B), a resist mask 20 for covering the region in which the collecting electrode traces 11 will be formed is photolithographically formed on the cap layer 14. Using the mask 20, the cap layer 14, the metal layer 13, and the adhesive layer 12 are anisotropically etched with a chlorine (Cl) gas and a fluorine (F) gas so that the upper surface of the glass substrate 2 is exposed, and a plurality of strip-shaped collecting electrode traces 11 are formed on the glass substrate 2.

As a result, the collecting electrode traces 11 are obtained having a thickness T and width W that are within normal ranges.

The resist mask 20 formed by the step P2 is made as thick as possible in order to protect the collecting electrode traces 11 when the trench 16 is formed in the next step P3.

In the step P3 (FIG. 4C), the resist mask 20 formed in the step P2 is used to perform anisotropic etching of the glass substrate 2 between the collecting electrode traces 11 while an etching selectivity ratio of approximately 3 to 10 is maintained with respect to the resist mask 20 and the titanium-nitride cap layer 14 on the collecting electrode traces 11. The trench 16 is formed in a self-aligning manner in relation to the collecting electrode traces 11. The resulting trench 16 has a trapezoidal cross-sectional shape. The opening of the trench 16 corresponds to the gap K between the collecting electrode traces 11, and the depth F of the trench 16 to the groove bottom 16a is approximately 5 to 10 μm. The anisotropic etching is carried out using a mixed gas that contains tetrafluoromethane ($CF_4$), hexafluoroethane ($C_2F_6$), perfluoropropane ($C_3F_8$), perfluorocyclobutane ($C_4F_8$), or another CF-series gas as a main component, to which is added methane ($CH_4$), trifluoromethane ($CHF_3$), difluoromethane ($CH_2F_2$) or another CH-series gas.

Adding the CH series gas allows the angle a of the inclined edges of the trench 16 to be about 70°.

Even if some of the resist mask 20 is etched and the cap layer 14 is partly exposed, the cap layer 14, which is formed from titanium nitride or the like, functions as a hardmask during the etching, and the trench 16 can be formed in a self-aligning manner in relation to the collecting electrode traces 11.

In the step P4 (FIG. 5A), the resist mask 20 formed in the step P2 is removed, and sputtering or CVD is carried out to deposit titanium nitride or the like to a thickness of approximately 10 to 100 nm on the glass substrate 2 within the trench 16 and on the upper and side surfaces of the collecting electrode traces 11. The deposited layer of titanium nitride or the like is anisotropically etched, so that the glass substrate 2 within the trench 16 and the upper surfaces of the collecting electrode traces 11 are exposed, and the side wall elements 15 are formed on the side surfaces of the collecting electrode traces 11.

As a result, the cap layer 14 and the side wall elements 15 made of titanium nitride or another material are formed on the surfaces of the collecting electrode traces 11 that do not touch the glass substrate 2, and the collecting electrode traces 11 can be made more resistant to oxidation as well as more resistant to corrosion due to the electrolyte solution 5.

In the step P5 (FIG. 5B), screen printing is employed to apply a titanium oxide paste to the upper surface of the glass substrate 2. The interior of the trench 16 is filled in with the titanium oxide paste, and a titanium oxide paste layer covering the collecting electrode traces 11 is formed. The paste and the layer are sintered at approximately 450°.

As a result, a solvent in the titanium oxide paste layer evaporates, the titanium oxide microparticles are physically and electrically bonded, and a porous structure is formed. Thus, the porous layer 3 is formed on the collecting electrode traces 11. The resulting porous layer 3 has a predetermined thickness M (approximately 10 µm).

The substrate 2 and porous layer 3 are then immersed for a prescribed period of time in an alcohol solution containing the sensitizing dye, which comprises a ruthenium metal complex. The sensitizing dye is adsorbed onto the titanium oxide surface of the porous structure, which is dried after being washed with ethanol ($CH_3CH_2OH$) or the like.

The first structure of the solar cell 1 is prepared by the above-described steps P1 to P5. In this first structure, the thick porous layer 3 onto which the sensitizing dye has been adsorbed is formed on the glass substrate 2.

Subsequently, the frame 4 of the second structure is joined to the peripheral edge of the glass substrate 2 of the first structure such that the catalyst layer 7 of the second structure faces the porous layer 3 of the first structure. The second structure is prepared by joining the counter electrode 9 to the frame 4. The counter electrode 9 has been prepared by a separate process. The electrolyte solution 5 is introduced between the porous layer 3 and the counter electrode 9 through an injection opening (not shown) of the frame 4. The injection opening is closed using an epoxy resin material or another appropriate material. Thus, the electrolyte solution 5 is sealed in the space defined by the first structure and the second structure (or sealed in the solar cell 1).

The dye-sensitized solar cell 1 shown in FIG. 1 is thus obtained.

As described above, the porous layer 3 that fills the trench 16 formed by excavating the glass substrate 2 between the collecting electrode traces 11 causes the effective thickness of the porous layer 3 to be approximately 1.5 to 2 times its normal thickness, without having to change the thickness T of the collecting electrode traces 11. The amount of the sensitizing dye that is adsorbed onto the porous layer 3 can accordingly be increased without narrowing the opening through which light enters via the glass substrate 2. Thus, it becomes possible to readily provide a dye-sensitized solar cell 1 having a thick porous layer 3 and an increased photoelectric-conversion efficiency.

In this embodiment, the trench is formed to a groove depth F that is within a range of between 50% and 100% of the diffusion length of an excited electron, the gap K between the collecting electrode traces 11 has a length of approximately 150% of the diffusion length of the excited electron, the thickness M of the porous layer 3 on the collecting electrode traces 11 is equal to the diffusion length of the excited electron, and the collecting electrode traces 11 are disposed within the range of the diffusion length of the excited electron. Therefore, all of the excited electrons released from the sensitizing dye by the incoming sunlight can be made to flow into the collecting electrode traces 11.

The aspect ratio of the collecting electrode traces 11 of the solar cell 1 is approximately 1, as in an ordinary solar cell. Therefore, processing complexity that would otherwise be caused by a high aspect ratio is eliminated in the etching process (step P2) when the collecting electrode traces 11 are formed. Thus, the collecting electrode traces 11 can be readily formed by etching. Furthermore, wasteful use of titanium nitride, tungsten, and other materials is eliminated so that manufacturing costs can be reduced.

In the step P3, the resist mask 20 formed by the step P2 is preserved, and the trench 16 is formed in a self-aligning manner in relation to the collecting electrode traces 11.

Therefore, it is no longer necessary for the resist mask 20 to be formed anew when the trench 16 is formed. Thus, it is possible to minimize any increase in the number of steps beyond those in the procedure for manufacturing a conventional dye-sensitized solar cell.

In this embodiment, the angle a between the inclined edges and upper base of the trapezoidal cross-sectional shape of the trench 16 is about 70 degrees. Accordingly, a region ready to be filled with the porous layer 3 is present, and a deposited layer of titanium nitride or other material can also remain on the collecting electrode traces 11 when the side wall elements 15 are formed. Thus, the side wall elements 15 can be formed to the optimal thickness.

It should be noted that in the illustrated embodiment the metal layer 13 of the collecting electrode traces 11 is imparted oxidation-resistance and corrosion-resistance by the cap layer 14 and side wall elements 15 formed on the collecting electrode traces 11, but the cap layer 14 and side wall elements 15 may be formed according to need, and are not essential elements.

The cap layer 14 of the solar cell 1 may be made thicker than dictated by the film thickness indicated above. Such a cap layer 14 may be used as a hardmask in the etching procedure when forming the trench 16, and the trench 16 may be formed in a self-aligning manner in relation to the collecting electrode traces 11.

Although one type of sensitizing dye is adsorbed in the porous layer 3 in the above-described embodiment, two or more types of sensitizing dye that absorb light of differing wavelength regions may be adsorbed in the porous layer 3.

In such an arrangement, the different adsorbed sensitizing dyes are excited by the light from the different wavelength regions and will release respectively excited electrons. Therefore, it is possible to further improve the photoelectric-conversion efficiency of the thick porous layer 3.

In this case, two or more types of sensitizing dye may be successively layered and adsorbed in the porous layer 3, or may be mixed and adsorbed (in the form of a single layer) in the porous layer 3.

As described above, trenches that are trapezoidal in cross-section and have openings corresponding to the gaps between respective two adjacent strip-shaped collecting electrode traces formed on a glass substrate of a dye-sensitized solar cell are provided in the glass substrate between the collecting electrode traces. Also, a porous layer onto which at least one kind of sensitizing dye is adsorbed is formed on the glass substrate such that the porous layer extends over the glass substrate within the trench and also over the collecting electrode traces. It is therefore possible to readily allow a porous layer that fills the trench to increase the effective thickness of the porous layer, as a whole, without changing the thickness of the collecting electrode traces and without narrowing the size of the opening through which light enters via the glass substrate. This can increase the amount of sensitizing dye adsorbed onto the porous layer, and improve the photoelectric-conversion efficiency of the solar cell due to the increased thickness of the porous layer.

In the embodiment described above, the titanium oxide paste for forming the porous layer of the dye-sensitized solar cell is applied using screen printing, but any suitable application method (e.g., coating) may be used to apply the paste.

This application is based on Japanese Patent Application No. 2008-187466 filed on Jul. 18, 2008 and the entire disclosure thereof is incorporated herein by reference.

What is claimed is:

1. A dye-sensitized solar cell comprising:
   a translucent substrate;

a plurality of collecting electrode traces formed on said translucent substrate, said translucent substrate having a plurality of trenches, each trench being positioned between respective ones of said collecting electrode traces, each trench having a trapezoidal cross-sectional shape, said collecting electrode traces being absent in said trenches;

a porous layer provided on and over aid collecting electrode traces and the trenches of said translucent substrate, with said trenches being filled with said porous layer, said porous layer directly contacting said translucent substrate; and at least one kind of sensitizing dye absorbed in the porous layer, said sensitizing dye releasing electrons upon excitation by light, the released electrons flowing from the sensitizing dye and into the collecting electrode traces.

2. The dye-sensitized solar cell according to claim 1, wherein a depth of each trench is bet between 50% and 100% of a diffusion length of an excited electron.

3. The dye-sensitized solar cell according to claim 1, wherein a thickness of said porous layer measured from said collecting electrode traces is equivalent to a diffusion length of an excited electron.

4. The dye-sensitized solar cell according to claim 1, wherein said at least one kind of sensitizing dye includes a plurality of kinds of sensitizing dye.

5. The dye-sensitized solar cell according to claim 1 further comprising a counter electrode, wherein said porous layer serves as an anode electrode of the solar cell and said counter electrode serves as a cathode electrode of the solar cell.

6. The dye-sensitized solar cell according to claim 5, wherein said counter electrode includes a metal plate and a catalyst layer provided on the metal plate.

7. The dye-sensitized solar cell according to claim 5 further comprising an electrolyte provided between the counter electrode and the porous layer.

8. The dye-sensitized solar cell according to claim 1, wherein said porous layer has a nano-size porous structure.

9. The dye-sensitized solar cell according to claim 1, wherein said at least one kind of sensitizing dye includes Ru.

10. The dye-sensitized solar cell according to claim 1, wherein a width of each trench is 150% of a diffusion length of an excited electron.

11. The dye-sensitized solar cell according to claim 1 further comprising a protective element provided over the collecting electrode traces to impart an oxidation resistance to the collecting electrode traces.

12. A method of manufacturing a dye-sensitized solar cell of claim 1, comprising:

providing a translucent substrate;

forming a metal layer on said translucent substrate;

forming on said metal layer a resist mask that covers a region in which a plurality of collecting electrode traces will be formed;

etching said metal layer with said resist mask to form said plurality of collecting electrode traces on said translucent substrate;

etching said translucent substrate between said collecting electrode traces with said resist mask to form a plurality of trenches in a self-aligning manner, each trench being positioned between respective ones of said collecting electrode traces such that said collecting electrode traces are absent in said trenches, each trench being trapezoidal in cross-section;

removing said resist mask;

applying a paste containing microparticles of a metallic oxide on and over the collecting electrode traces and the trenches of said translucent substrate;

sintering said paste to form a porous layer that extends over said translucent substrate and over said collecting electrode traces with said trenches being filled with said porous layer, and with said porous layer directly contacting said translucent substrate; and making said porous layer adsorb at least one kind of sensitizing dye therein.

13. The method according to claim 12, wherein a depth of each trench is between 50% and 100% of a diffusion length of an excited electron.

14. The method according to claim 12, wherein a film thickness of said porous layer measured from said collecting electrode traces is equivalent to a diffusion length of an excited electron.

15. The method according to claim 12, wherein said at least one kind of sensitizing dye includes a plurality of kinds of sensitizing dye.

16. The method according to claim 12, wherein said sintering is performed at a temperature of 450 degrees.

17. The method according to claim 12 further comprising washing the substrate with ethanol after said sintering.

18. The method according to claim 12 further comprising connecting a counter electrode and a frame to the substrate and introducing an electrolyte between the porous layer and the counter electrode.

19. The method according to claim 15, wherein said plurality of kinds of sensitizing dyes are absorbed in at least one layer.

20. The method according to claim 12, wherein said porous layer has a nano-size porous structure.

21. The dye-sensitized solar cell according to claim 1, further comprising a counter electrode, said porous layer being disposed between the counter electrode and the collecting electrode traces so as to be positioned on and over the trenches of the trapezoidal cross-sectional shape.

22. The dye-sensitized solar cell according to claim 1, wherein the porous layer has an upper surface positioned higher than each of the collecting electrode traces.

* * * * *